United States Patent [19]
Ko et al.

[11] Patent Number: 5,686,321
[45] Date of Patent: *Nov. 11, 1997

[54] LOCAL PUNCHTHROUGH STOP FOR ULTRA LARGE SCALE INTEGRATION DEVICES

[75] Inventors: Joe Ko, Hsin-Chu; Chih-Hung Lin, I-Lain, both of Taiwan

[73] Assignee: United Microelectronics Corp., Hsin-Chu, Taiwan

[*] Notice: The term of this patent shall not extend beyond the expiration date of Pat. No. 5,538,913.

[21] Appl. No.: 647,266

[22] Filed: May 6, 1996

Related U.S. Application Data

[63] Continuation of Ser. No. 275,267, Jul. 15, 1994, abandoned.
[51] Int. Cl.$^6$ ................................................. H01L 21/265
[52] U.S. Cl. .................................. 437/29; 437/44; 437/45
[58] Field of Search ........................... 437/27, 29, 41, 437/44; 257/327, 336, 344

[56] References Cited

U.S. PATENT DOCUMENTS

| | | | |
|---|---|---|---|
| 5,364,806 | 11/1994 | Ma et al. | 437/43 |
| 5,372,960 | 12/1994 | Davies et al. | 437/44 |
| 5,374,574 | 12/1994 | Kwon | 437/44 |
| 5,374,575 | 12/1994 | Kim et al. | 437/44 |
| 5,399,508 | 3/1995 | Nowak | 437/27 |
| 5,413,949 | 5/1995 | Hong | 437/44 |
| 5,538,913 | 7/1996 | Hong | 437/44 |

OTHER PUBLICATIONS

"0.15 μm CMOS With High Reliability and Performance", IEDM, Nov. 1993, pp. 883–886.

"Source–to–Drain Nonuniformity Doped Channel (NUDC) MOSFET Structures for High Current Drivability and Threshold Voltage Controllability", IEEE Transaction on Electron Devices, vol. 39, No. 11, Nov. 1992, pp. 2541–2552.

*Primary Examiner*—John Niebling
*Assistant Examiner*—Richard A. Booth
*Attorney, Agent, or Firm*—William H. Wright

[57] ABSTRACT

The invention relates to an improved MOSFET device structure for use in ultra large scale integration and the method of forming the device structure. A local punchthrough stop region is formed directly under the gate electrode using ion implantation. The local punchthrough stop region reduces the expansion of the depletion region in the channel and thereby increases the punchthrough voltage. The local punchthrough stop region is self-aligned with the gate electrode and source/drain region so that critical spacings are maintained even for sub micron devices. The source and drain junction capacitances are also reduced. The invention can be used in either N channel or P channel MOSFET devices. The invention can be used with a conventional source/drain structure as well as a double doped drain structure and a light doped drain structure.

13 Claims, 5 Drawing Sheets

LOCAL PUNCHTHROUGH STOP FOR ULTRA LARGE SCALE INTEGRATION DEVICES

This is a continuation of application Ser. No. 08/275,267 filed on Jul. 15, 1994, now abandoned.

RELATED PATENT APPLICATION (1) Ser. No. 08/394,587, filed Feb. 27, 1995, entitled "New Self-Aligned Anti-Punchthrough Implantation Process," assigned to the same assignee.

BACKGROUND OF THE INVENTION

(1) FIELD OF THE INVENTION

The invention relates to an improved MOSFET device structure for use in ultra large scale integration and the method of forming the device structure. A local punchthrough stop region is formed directly under the gate electrode using ion implantation. The local punchthrough stop region reduces the expansion of the depletion region in the channel and thereby increases the punchthrough voltage. The local punchthrough stop region is self-aligned with the gate electrode and source/drain region so that critical spacings are maintained even for sub micron devices. The source and drain junction capacitances are also reduced. The invention can be used in either N channel or P channel MOSFET devices.

(2) DESCRIPTION OF THE RELATED ART

In using field effect transistors in the formation of ultra large scale integrated circuit devices device punchthrough has become an increasing problem. Punchthrough ion implantations have been used near the source and drain to reduce the electric field in the channel thereby increasing the punchthrough voltage. These methods have had the problem on increasing the source and drain capacitance thereby adversely effecting device performance. The method of this invention uses a local punchthrough implant region which is self-aligned with the source/drain implantations and the gate electrode. The self-alignment maintains critical spacings and source and drain junction capacitances are held to a minimum.

Hot carrier reliability and performance of 0.15 micron CMOSFETs are discussed in a paper by Takeuchi et al, "0.15 um CMOS with High Reliability and Performance" in IEDM, Nov. 1993, Pages 883–886. Non uniformly doped channels are discussed in a paper by Okumura et al, "Source-to-Drain Nonuniformly Doped Channel (NUDC) MOSFET Structures for High Current Drivability and Threshold Voltage Controllability," IEEE Transactions on Electron Devices, Vol. 39, No. 11, November 1992, Pages 2541–2552.

SUMMARY OF THE INVENTION

It is a principle object of the invention to provide a local punchthrough stop region for field effect transistors, or MOSFETs, used in ultra large scale integration devices which will increase the punchthrough voltage.

It is a further object of the invention to provide a method of forming a local punchthrough stop region for field effect transistors, or MOSFETs, used in ultra large scale integration devices which will increase the punchthrough voltage.

These objectives are achieved by increasing the substrate charge concentration in a region directly below the gate electrode forming a punchthrough stop region. The punchthrough stop region is self-aligned with the gate electrode by using ion implantation through the opening in a nitride layer where the gate electrode will be formed. A polysilicon spacer on the sidewalls of the gate electrode opening insures that the punchthrough stop region has sufficient separation from the source/drain regions. If this separation is too small, as may happen without a self alignment process, the junction capacitance will increase and device performance will be degraded.

This invention can be used with conventional source/drain structures as well as light doped drain or double doped drain structures. The invention can be used for both N channel and P channel MOSFET devices. The self alignment nature of forming the punchthrough stop region helps increase channel mobility and reduce source and drain capacitance.

DESCRIPTION OF THE PREFERRED EMBODIMENTS

Figure 1A:
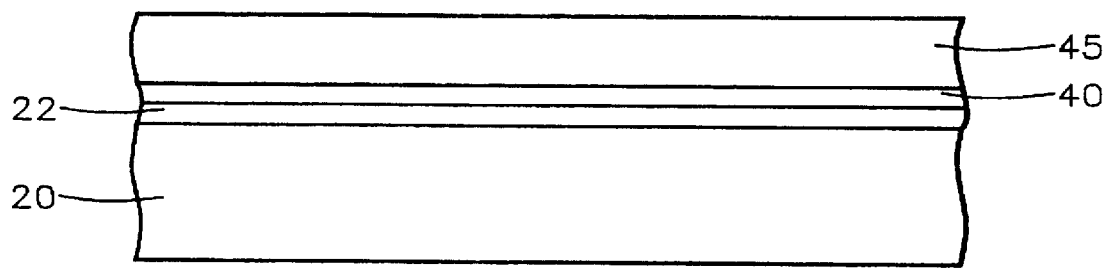
FIG. 1A is a cross section view of a MOSFET device showing a silicon substrate with a threshold voltage implant having a layer of gate oxide formed on the substrate surface and a layer of nitride formed on the gate oxide layer.
Figure 1B:
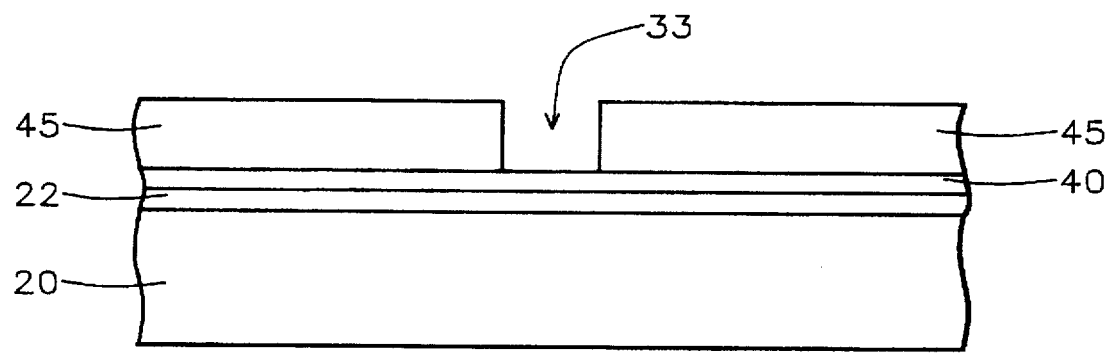
FIG. 1B is a cross section view of a MOSFET device with a gate electrode opening formed in the nitride layer.
Figure 1C:
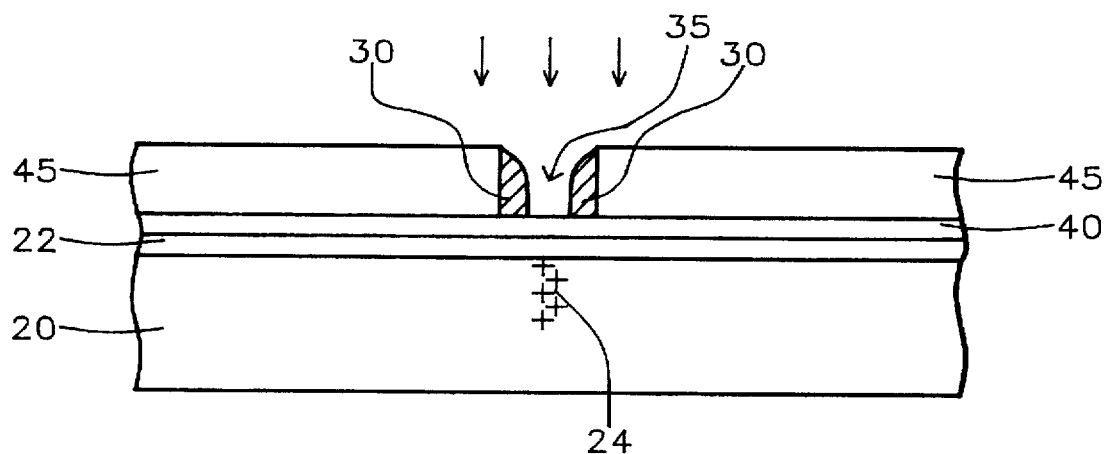
FIG. 1C is a cross section view of a MOSFET device with a polysilicon spacer formed on the sidewalls of the gate electrode opening, the ion implant beam used to form the punchthrough stop region, and the punchthrough stop region.

Refer now to FIG. 1A through FIG. 1E and FIG. 2. There is shown a method for forming the punchthrough stop region for a MOSFET device with a conventional source/drain structure. The punchthrough stop region can be formed in either an N channel or a P channel MOSFET. FIG. 1A shows a cross section of the device with a threshold voltage adjustment ion concentration region 22 formed in a silicon substrate 20 near the surface by means of ion implantation. For an N channel MOSFET a P⁻ silicon substrate and a P⁻ threshold voltage adjustment ion concentration is used. For a P channel MOSPET a N⁻ silicon substrate and a N⁻ threshold voltage adjustment concentration is used. A gate oxide layer 40 is formed on the surface of the silicon substrate and a nitride layer 45 is formed on the gate oxide layer. As shown in FIG. 1B a gate electrode opening 33 having sidewalls is formed in the nitride layer 45 using conventional lithography and etching techniques. As shown in FIG. 1C a polysilicon spacer 30 is then formed on the sidewalls of the gate electrode opening in the nitride layer. The polysilicon spacer is formed by forming a layer of polysilicon on the substrate surface followed by vertically anisotropically etching the polysilicon using conventional methods. An example of such a conventional method is described in the book "VLSI TECHNOLOGY" Second Edition, by S. M. Sze, Published by McGraw-Hill Book Co., New York, N.Y., 1988, Pages 396–398. After formation of the polysilicon spacer a P⁻ punchthrough stop region 24 is formed, for an N channel MOSFET, using ion implantation and masking. For a P channel MOSFET a N⁻ punchthrough stop region 24 is formed. The polysilicon spacer 30 forms the critical edge of the mask making the punchthrough stop region 24 self-aligned to be directly below the center of the gate electrode region 35. The P⁻ punchthrough stop region 24 is formed using an ion beam 50 of boron with a beam density of between about $5 \times 10^{12}$ and $5 \times 10^{13}$ ions/cm² at between about 50 and 300 keV. The N⁻ punchthrough stop region 24 is formed using an ion beam 50 of phosphorous with a beam density of between about $1 \times 10^{12}$ and $3 \times 10^{13}$ ions/cm² at between about 100 and 300 keV.

Figure 1D:
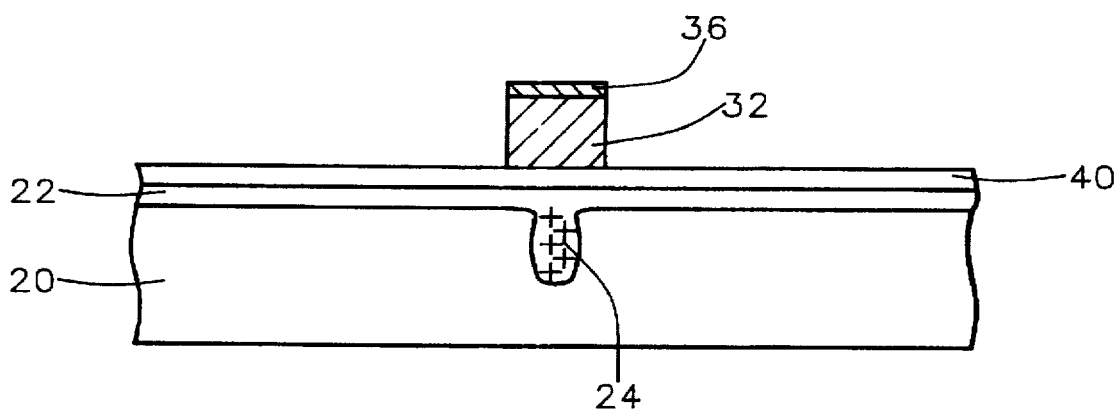
FIG. 1D is a cross section view of a MOSFET device with the gate electrode formed after the formation of the punchthrough stop region. A silicide layer is shown on the surface of the polysilicon gate electrode.
Figure 1E:
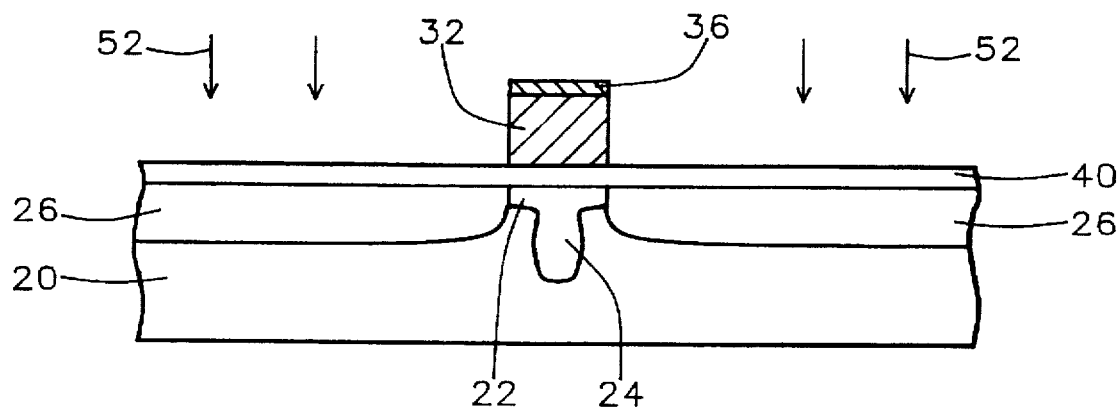
FIG. 1E is a cross section view of a MOSFET device after formation of the gate electrode and punchthrough stop region showing the ion implant beam used to form the source/drain region.

A layer of polysilicon is then deposited on the surface of the substrate so as to completely fill the remaining gate electrode opening 35. The polysilicon is then etched back to the plane of the nitride layer 45 using conventional methods. An example of such a conventional method is described in the previously cited book "VLSI TECHNOLOGY" Second Edition, by S. M. Sze, Pages 396–398. As shown in FIG. 1D the nitride layer is then etched away using conventional methods, leaving the gate electrode 32. An example of such a conventional method is described in the previously cited book "VLSI TECHNOLOGY" Second Edition, by S. M. Sze, Pages 225–226. If desired, a layer of silicide 36 may be formed on the polysilicon gate electrode to improve contact resistance. Next, as shown in FIG. 1E, a first source/drain region 26 is formed using ion implantation methods and masking. The polysilicon gate electrode forms a part of the mask which provides self alignment between the first source/drain region and the punchthrough stop region. For an N channel MOSFET the first source/drain region 26 is N⁺ formed using an ion beam 52 of arsenic with a beam density of between about $1 \times 10^{15}$ and $8 \times 10^{15}$ ions/cm² at between about 40 and 80 keV. For a P channel MOSFET the source/drain region 26 is P⁺ formed using an ion beam 52 of $BF_2$ with a beam density of between about $1 \times 10^{15}$ and $5 \times 10^{15}$ ions/cm² at between about 30 and 60 keV.

Figure 2:
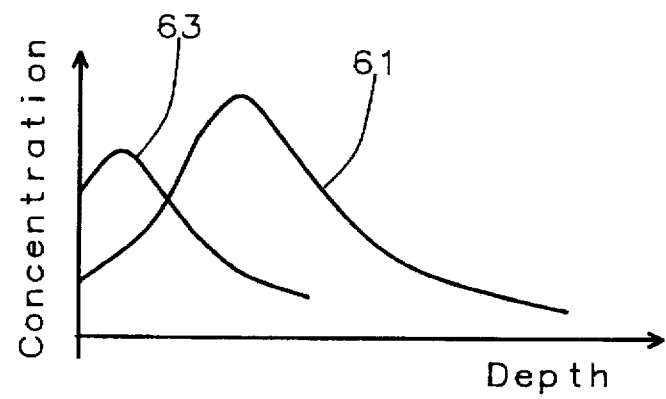
FIG. 2 shows the depth of the threshold voltage adjustment doping concentration and the punchthrough stop region doping concentration in the region directly below the gate electrode.

FIG. 2 shows the concentration as a function of depth of the threshold voltage implant 63 and the punchthrough stop region implant 61. The peak of the threshold voltage implant concentration is between about $5 \times 10^{16}$ and $1 \times 10^{18}$/cm³ for an N channel MOSFET and between about $5 \times 10^{16}$ and $1 \times 10^{18}$/cm³ for a P channel MOSFET. The peak of the punchthrough stop region concentration is between about $5 \times 10^{17}$ and $1 \times 10^{19}$/cm³ for an N channel MOSFET and between about $5 \times 10^{17}$ and $1 \times 10^{19}$/cm³ for a P channel MOSFET. The peak of the punchthrough stop region concentration occurs at a depth of between about 0.15 microns and 0.35 microns below the silicon surface, which is about the depth of the source/drain region.

An embodiment for a method of forming the punchthrough stop region for a MOSFET device using a double doped drain structure is shown in FIG. 1A through FIG. 1D, FIG. 2, FIG. 3A and FIG. 3B. As in the previous embodiment either an N channel MOSFET or a P channel MOSFET can be used. Referring to FIG. 1A through FIG. 1D, the method is the same as described in the previous embodiment through the formation of the polysilicon gate electrode 32. As in the previous embodiment, a layer of silicide 36 may be formed on the polysilicon gate electrode to improve contact resistance.

Figure 3A:
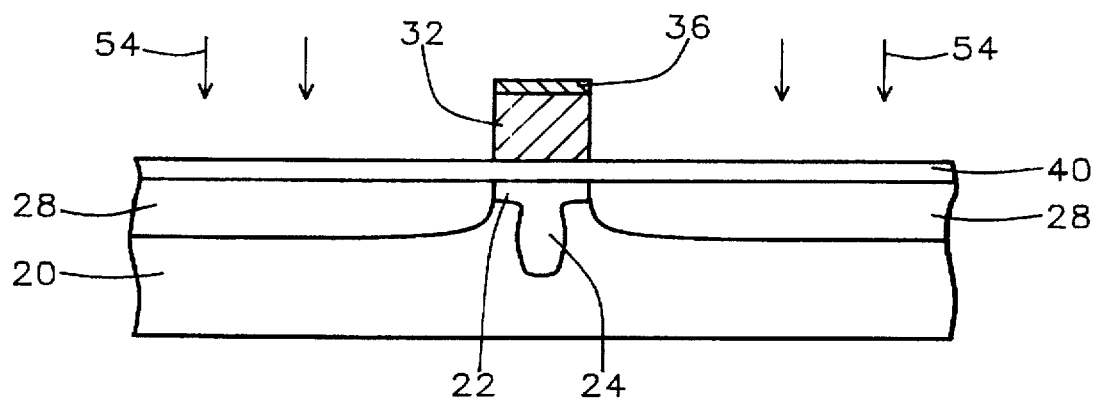
FIG. 3A is a cross section view of a MOSFET device showing the ion implant beam forming the lower source/drain concentration region for a double doped drain device.

Next, as shown in FIG. 3A, a second source/drain region 28 is formed using ion implantation methods and masking. The polysilicon gate electrode 32 forms a part of the mask which provides self alignment between the second source/drain region 28 and the punchthrough stop region 24. For an N channel MOSFET the second source/drain region 28 is N⁻ formed using an ion beam 54 of phosphorus with a beam density of between about $1 \times 10^{13}$ and $1 \times 10^{14}$ ions/cm² at between about 35 and 70 keV. For a P channel MOSFET the second source/drain region 28 is P⁻ formed using an ion beam 54 of $BF_2$ with a beam density of between about $1 \times 10^{13}$ and $1 \times 10^{14}$ ions/cm² at between about 25 and 60 keV.

Figure 3B:
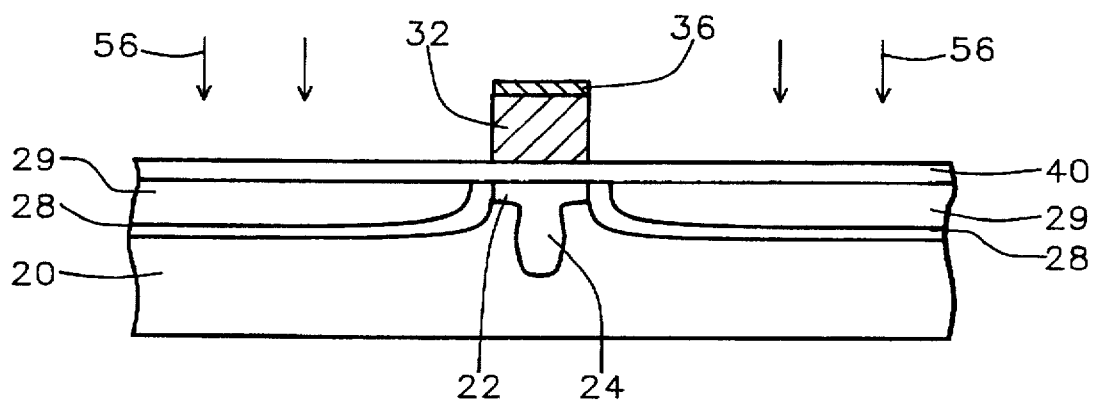
FIG. 3B is a cross section view of a MOSFET device showing the upper source/drain concentration region for a double doped drain device.

Next, as shown in FIG. 3B, a third Source/drain region 29 is formed using ion implantation methods and masking. For an N channel MOSFET the third source/drain region 29 is N⁺ formed using an ion beam 56 of arsenic with a beam density of between about $1 \times 10^{15}$ and $8 \times 10^{15}$ ions/cm² at between about 40 and 80 keV. For a P channel MOSFET the third source/drain region 28 is P⁺ formed using an ion beam 56 of $BF_2$ with a beam density of between about $1 \times 10^{15}$ and $5 \times 10^{15}$ ions/cm² at between about 30 and 60 keV. The threshold voltage implant concentration 63 and the punchthrough stop region implant concentration 61 as a function of depth are the same as in the previous embodiment, shown in FIG. 2.

An embodiment for a method of forming the punchthrough stop region for a MOSFET device using a light doped drain structure is shown in FIG. 1A through FIG. 1D, FIG. 2, FIG. 4A, FIG. 4B, and FIG. 4C. As in the previous embodiments either an N channel MOSFET or a P channel MOSFET can be used. Referring to FIG. 1A through FIG. 1D, the method is the same as described in the first embodiment through the formation of the polysilicon gate electrode 32, however the silicide layer is not formed on the polysilicon gate electrode.

Figure 4A:
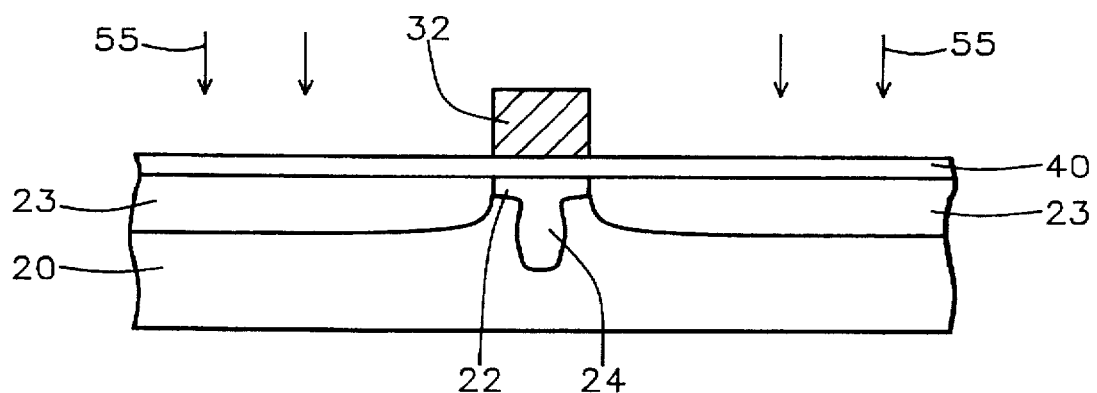
FIG. 4A is a cross section view of a MOSFET device showing the ion implant beam used to form the first source/drain concentration region for a light doped drain device.
Figure 4B:
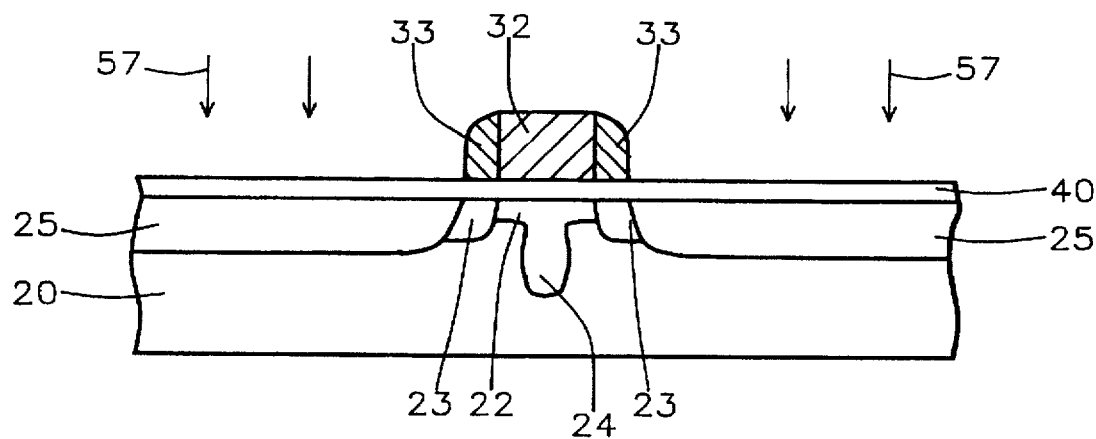
FIG. 4B is a cross section view of a MOSFET device after formation of the first source/drain concentration region for a light doped drain device showing formation of the insulator spacer on the sidewalls of the gate electrode and the ion implant beam forming the second source/drain concentration region.

Next, as shown in FIG. 4A, a fourth source/drain region 23 is formed using ion implantation methods and masking. The polysilicon gate electrode 32 forms a part of the mask which provides self alignment between the fourth source/drain region 23 and the punchthrough stop region 24. For an N channel MOSFET the fourth source/drain region 23 is N⁻ formed using an ion beam 55 of phosphorus or arsenic with a beam density of between about $1 \times 10^{13}$ and $1 \times 10^{14}$ ions/ cm² at between about 35 and 70 keV. For a P channel MOSFET the fourth source/drain region 23 is P⁻ formed using an ion beam 55 of $BF_2$ with a beam density of between about $1×10^{13}$ and $1×10^{14}$ ions/cm² at between about 25 and 60 keV. Next, as shown in FIG. 4B, an insulator spacer 33 is formed on the sidewalls of the polysilicon gate electrode 32. The insulator spacer is formed by forming a layer of insulator, such as $SiO_2$, on the substrate surface followed by vertically anisotropically etching the oxide using conventional methods. An example of such a conventional method is described in the previously cited book "VLSI TECHNOLOGY" Second Edition, by S. M. Sze, Pages 192–195.

Figure 4C:
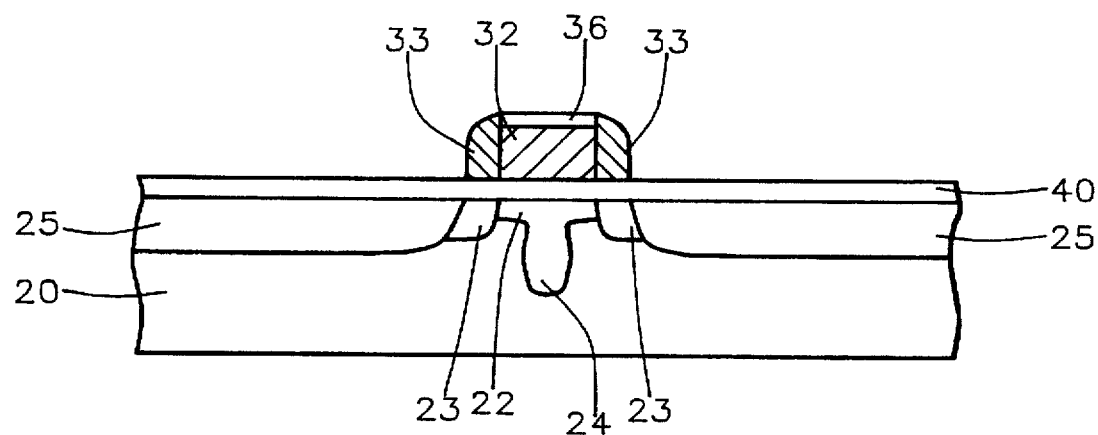
FIG. 4C is a cross section view of a MOSFET device showing a light doped drain device. A silicide layer is formed on the surface of the polysilicon gate electrode.

Next, as shown in FIG. 4B, a fifth source/drain region 25 is formed using ion implantation methods and masking. For an N channel MOSFET the fifth source/drain region 25 is N⁺ formed using an ion beam 57 of arsenic with a beam density of between about $1×10^{15}$ and $5×10^{15}$ ions/cm² at between about 40 and 80 keV. For a P channel MOSFET the fifth source/drain region 25 is P⁺ formed using an ion beam 57 of $BF_2$ with a beam density of between about $1×10^{15}$ and $5×10^{15}$ ions/cm² at between about 30 and 60 keV. As shown in FIG. 4C a silicide layer 36 can then be formed on the polysilicon gate electrode 32 to reduce contact resistance, if desired. The threshold voltage implant concentration 63 and the punchthrough stop region implant concentration 61 as a function of depth are the same as in the previous embodiments, shown in FIG. 2.

In the three preceding embodiments the punchthrough stop region and the source/drain regions are self-aligned relative to each other. This preserves critical separation distances at ultra large scale integration geometries and keeps source and drain junction capacitances low.

Refer now to FIG. 1E and FIG. 2, there is shown an embodiment of a punchthrough stop region 24 to improve the punchthrough voltage in a MOSFET device. The punchthrough stop region can be used with either an N channel MOSFET or a P channel MOSFET. FIG. 1E shows a cross section of a MOSFET showing a gate oxide layer 40, a first source/drain region 26, a polysilicon gate electrode 32, and an optional silicide layer 36 on the polysilicon gate electrode to reduce contact resistance. For an N channel MOSFET an N⁺ first source/drain region 26 is used and for a P channel a P⁺ first source/drain region 26 is used. A threshold voltage adjustment ion concentration region 22 is formed in the silicon substrate 20 near the surface by means of ion implantation. For an N channel MOSFET a P⁻ silicon substrate and a P⁻ threshold voltage adjustment ion concentration is used. For a P channel MOSFET a N⁻ silicon substrate and a N⁻ threshold voltage adjustment concentration is used. The punchthrough stop region 24 is self-aligned with the polysilicon gate electrode 32 and formed directly below it. For an N channel MOSFET a P⁻ punchthrough stop region is used and for a P channel MOSFET an N⁻ punchthrough stop region is used.

FIG. 2 shows the concentration as a function of depth of the threshold voltage implant 63 and the punchthrough stop region implant 61. The peak of the threshold voltage implant concentration is between about $5×10^{16}$ and $5×10^{18}$/cm³ for an N channel MOSFET and between about $5×10^{16}$ and $5×10^{18}$/cm³ for a P channel MOSFET. The peak of the punchthrough stop region concentration is between about $5×10^{17}$ and $1×10^{19}$/cm³ for an N channel MOSFET and between about $5×10^{17}$ and $1×10^{19}$/cm³ for a P channel MOSFET. The peak of the punchthrough stop region concentration occurs at a depth of between about 0.15 microns and 0.35 microns below the silicon surface, which is about the depth of the source/drain region. The punchthrongh stop region reduces the expansion of the depletion region in the channel region of the MOSFET which increases the punchthrough voltage. Since the punchthrough stop region 24, the gate electrode 32, and the source/drain region 26 are self-aligned relative to each other critical spacing is maintained and junction capacitance is minimized.

FIG. 3B shows an embodiment of a punchthrough stop region 24 formed in an ultra large scale integration device using a double doped drain structure. As in previous embodiments either N channel or P channel MOSFET devices can be used. The structure is the same as described in the previous embodiment except for the source/drain region. The double doped drain device uses a second source/drain region 29, N⁺ concentration for an N channel MOSFET and P⁺ concentration for a P channel MOSFET, and a third source/drain region 28, N⁻ concentration for an N channel MOSFET and P⁻ concentration for a P channel MOSFET. The punchthrough stop region 24 is as described in the previous embodiment.

FIG. 4C shows an embodiment of a punchthrough stop region 24 formed in an ultra large scale integration device using a light doped drain structure. As in previous embodiments either N channel or P channel MOSFET devices can be used. The structure is the same as described in the previous embodiment except for the source/drain region and the gate electrode. An insulator spacer 33, such as $SiO_2$, is formed on the sidewalls of the polysilicon gate electrode 32. A fourth source/drain region 23 is formed directly beneath the insulator spacer 33 having a N⁻ concentration for an N channel MOSFET and a P⁻ concentration for a P channel MOSFET. A fifth source/drain region 25 is formed adjacent to the fourth source/drain region, having an N⁺ concentration for an N channel MOSFET and a P⁺ concentration for a P channel MOSFET. The punchthrough stop region 24 is as described in the previous embodiment.

Figure 5:
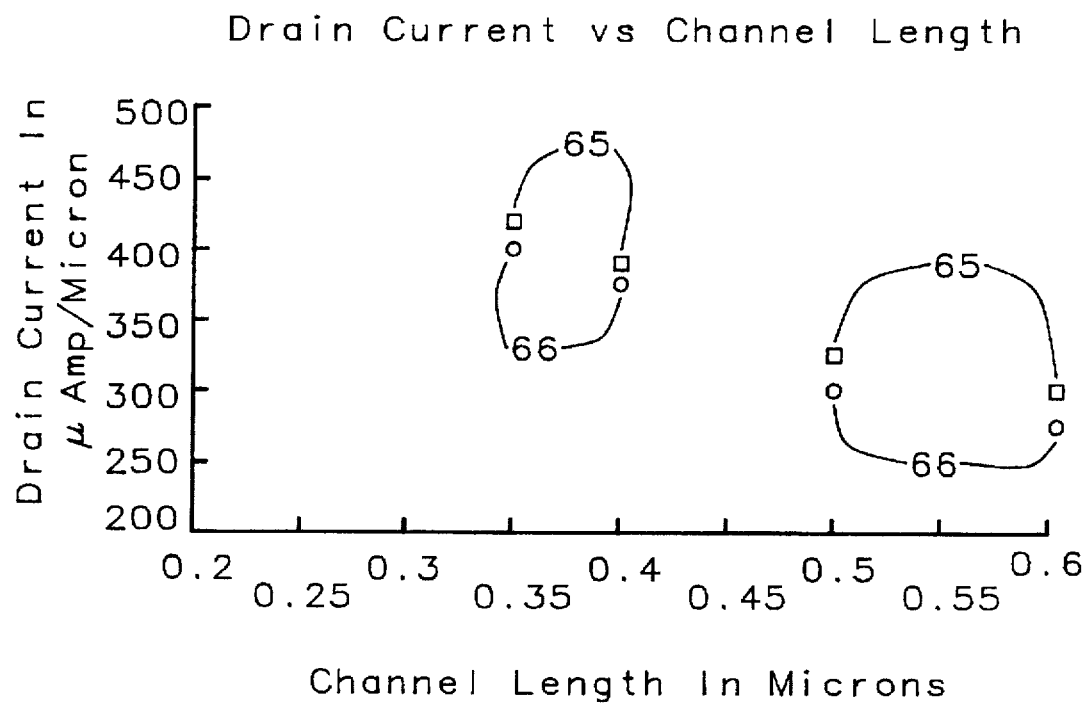
FIG. 5 is a graphical representation of simulation results of drain current, $I_{ds}$, vs. channel length for a device with a local punchthrough stop region and a conventional device.
Figure 6:
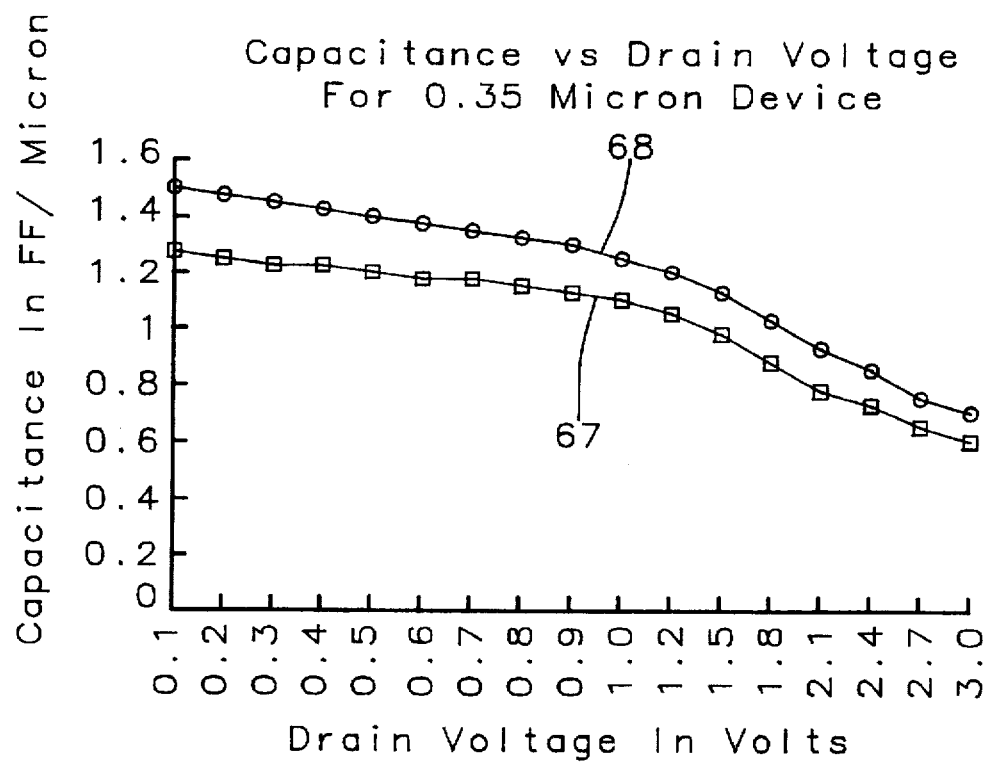
FIG. 6 is a graphical representation of simulation results of capacitance vs. drain voltage for a 0.35 micron device with a local punchthrough stop region and a 0.35 micron conventional device.

Refer now to FIG. 5 and FIG. 6, there are shown comparisons of simulation results of a device with a local punchthrough stop region and a conventional device. FIG. 5 shows the simulation results of drain current, $I_{ds}$, as a function of channel length for a device with a local punchthrough stop region 65 and a conventional device 66. The drain current of the local punchthrough stop region device is increased by about 3% to 10% at a given channel length over the range of channel length simulated. FIG. 6 shows the simulation results of capacitance for a device with a local punchthrough stop region 67 and a conventional device 68 as a function of drain voltage for a 0.35 micron device. The simulation results indicate about a 10% to 12% decrease in capacitance over the range of drain voltage simulated. Both the increased drain current for a given channel length and reduced capacitance will result in increased circuit performance.

While the invention has been particularly shown and described with reference to the preferred embodiments thereof, it will be understood by those skilled in the art that various changes in form and details may be made without departing from the spirit and scope of the invention.

What is claimed is:

1. A method for forming an integrated circuit on a semiconductor substrate, the method comprising the steps of:

forming a gate oxide layer on said semiconductor substrate;

forming a nitride layer on said gate oxide layer;

forming a gate electrode opening with sidewalls in said nitride layer;

forming polysilicon spacers on said sidewalls of said gate electrode opening thereby forming a reduced width opening;

implanting impurities through said reduced width opening to form a local punchthrough stop region;

depositing and etching back polysilicon on said semiconductor substrate so as to fill said reduced width opening with polysilicon thereby forming a polysilicon gate electrode within said gate electrode opening which incorporates said polysilicon spacers, wherein said polysilicon gate electrode completely covers said local punchthrough stop region; and forming a source/drain region.

2. The method of claim 1 wherein formation of said source/drain region comprises the steps of:

forming a first doubly diffused drain concentration region in said source/drain region using masking and ion implantation methods; and forming a second doubly diffused drain concentration region in the upper part of said source/drain region using masking and ion implantation methods.

3. The method of claim 1, further comprising the steps of:

forming a first lightly doped drain concentration region in said source/drain region using masking and ion implantation methods;

forming an insulator spacer on said sidewalls of said polysilicon gate electrode; and forming a second lightly doped drain concentration region in said source/drain region using masking and ion implantation methods.

4. The method of claim 1 wherein said semiconductor substrate is $P^-$ type and said local punchthrough stop region is $P^-$ type.

5. The method of claim 4 wherein said local punchthrough stop region is formed using a boron or $BF_2$ ion beam of between about $5\times10^{12}$ and $5\times10^{13}$ ions/cm$^2$ at between about 50 and 300 keV.

6. The method of claim 1 wherein said semiconductor substrate is $N^-$ type and said local punchthrough stop region is $N^-$ type.

7. The method of claim 6 wherein said local punchthrough stop region is formed using a phosphorus or arsenic ion beam of between about $1\times10^{12}$ and $3\times10^{13}$ ions/cm$^2$ at between about 100 and 300 keV.

8. The method of claim 1 wherein said semiconductor substrate is $P^-$ type and said source/drain region is $N^+$ type.

9. The method of claim 1 wherein said semiconductor substrate is $N^-$ type and said source/drain region is $P^+$ type.

10. The method of claim 2 wherein said semiconductor substrate is $P^-$ type, said first doubly diffused drain concentration region is $N^-$ type, and said second doubly diffused drain concentration region is $N^+$ type.

11. The method of claim 2 wherein said semiconductor substrate is $N^-$ type, said first doubly diffused drain concentration region is $P^-$ type, and said second doubly diffused drain concentration region is $P^+$ type.

12. The method of claim 3 wherein said semiconductor substrate is $P^-$ type, said first lightly doped drain concentration region is $N^-$ type, and said second lightly doped drain concentration region is $N^+$ type.

13. The method of claim 3 wherein said semiconductor substrate is $N^-$ type, said first lightly doped drain concentration region is $P^-$ type, and said second lightly doped drain concentration region is $P^+$ type.

* * * * *